United States Patent
Wolf et al.

(10) Patent No.: US 11,646,545 B2
(45) Date of Patent: May 9, 2023

(54) METHOD AND APPARATUS FOR MONITORING THE OPTICAL OUTPUT POWER OF A LASER DIODE WITH AN ASSOCIATED PHOTODIODE AND PARTICLE SENSOR DEVICE

(71) Applicants: Robert Bosch GmbH, Stuttgart (DE); TRUMPF PHOTONIC COMPONENTS GMBH, Ulm (DE)

(72) Inventors: Robert Wolf, Dresden (DE); Soren Sofke, Tubingen (DE); Philipp Gerlach, Ulm (DE); Susanne Weidenfeld, Weilheim (DE); Rico Srowik, Radebeul (DE)

(73) Assignees: Trumpf Photonic Components GmbH, Ulm (DE); Robert Bosch GmbH, Stuttgart (DE)

( * ) Notice: Subject to any disclaimer, the term of this patent is extended or adjusted under 35 U.S.C. 154(b) by 736 days.

(21) Appl. No.: 16/525,147

(22) Filed: Jul. 29, 2019

(65) Prior Publication Data
US 2020/0036157 A1 Jan. 30, 2020

(30) Foreign Application Priority Data
Jul. 30, 2018 (DE) .......................... 102018212687.9

(51) Int. Cl.
*H01S 5/068* (2006.01)
*H01S 5/026* (2006.01)
(Continued)

(52) U.S. Cl.
CPC ........ *H01S 5/0264* (2013.01); *G01N 15/0211* (2013.01); *H01S 5/0683* (2013.01); *H01S 5/06808* (2013.01); *H01S 5/183* (2013.01)

(58) Field of Classification Search
None
See application file for complete search history.

(56) References Cited

U.S. PATENT DOCUMENTS 5,414,280 A * 5/1995 Girmay ............... H01S 5/06808
372/24
6,483,862 B1 * 11/2002 Aronson .................. H01L 27/15
372/50.1
(Continued)

FOREIGN PATENT DOCUMENTS

CN 113273039 A * 8/2021 ............ G01J 1/4257
DE 10 2015 207 289 A1 10/2016
(Continued)

OTHER PUBLICATIONS

Hertsens ("Measuring diode laser characteristics"; Application note #5, ILX Lightwave; 2005). (Year: 2005).*
(Continued)

*Primary Examiner* — Tod T Van Roy
(74) *Attorney, Agent, or Firm* — Maginot, Moore & Beck LLP (57) ABSTRACT

The present invention provides methods and an apparatus for monitoring the optical output power of a laser diode (LD) having an associated photodiode (PD), and a particle sensor apparatus. The photodiode (PD) is operable together with the laser diode (LD), wherein it detects the light (LS) of the laser diode (LD) and converts it into an electrical current, and is thermally coupled to the laser diode (LD). Monitoring of the optical output power P is effected during the operation of the laser diode (LD) and is based on current measurements and/or voltage measurements at the laser diode (LD) and at the photodiode (PD).

17 Claims, 2 Drawing Sheets (51) Int. Cl.
   *G01N 15/02* (2006.01)
   *H01S 5/183* (2006.01)
   *H01S 5/0683* (2006.01)

(56) References Cited

U.S. PATENT DOCUMENTS

| | | | |
|---|---|---|---|
| 7,440,865 B1 | 10/2008 | Hofmeister et al. | |
| 7,916,162 B2* | 3/2011 | Inukai | B41J 2/442 |
| | | | 347/237 |
| 8,036,254 B2* | 10/2011 | Ishibashi | G11B 7/1263 |
| | | | 372/38.1 |
| 9,142,937 B2* | 9/2015 | Locklin | H01S 5/125 |
| 9,985,414 B1* | 5/2018 | Wise | H01S 5/06812 |
| 10,361,537 B2* | 7/2019 | Gudaitis | H01S 5/06808 |
| 11,193,870 B2* | 12/2021 | Wolf | H01S 5/06825 |
| 2003/0035451 A1* | 2/2003 | Ishida | H01S 5/042 |
| | | | 372/38.02 |
| 2004/0202216 A1* | 10/2004 | Fairgrieve | H01S 5/042 |
| | | | 372/38.07 |
| 2006/0262822 A1 | 11/2006 | Tatum | |
| 2007/0030868 A1* | 2/2007 | Sekigawa | H01S 5/0683 |
| | | | 372/29.015 |
| 2016/0313243 A1* | 10/2016 | Dittrich | G01N 15/06 |
| 2019/0383717 A1* | 12/2019 | Weichmann | H01S 5/183 |
| 2020/0033243 A1* | 1/2020 | Wolf | G01N 21/47 |
| 2020/0036157 A1* | 1/2020 | Wolf | H01S 5/06808 |

FOREIGN PATENT DOCUMENTS

| | | | | |
|---|---|---|---|---|
| EP | 2 071 568 A1 | | 6/2009 | |
| EP | 2071568 A1 | * | 6/2009 | G11B 7/126 |
| JP | 07221369 A | * | 8/1995 | |
| JP | H07-221369 A | | 8/1995 | |
| JP | H08-139869 A | | 5/1996 | |
| WO | WO-2021151860 A1 | * | 8/2021 | |

OTHER PUBLICATIONS

German Office Action corresponding to German Patent Application No. 10 2018 212 687.9, dated Mar. 21, 2019 (10 pages).
German Office Action corresponding to German Patent Application No. 10 2018 212 687.9, dated Jun. 11, 2021 (10 pages).

* cited by examiner

METHOD AND APPARATUS FOR MONITORING THE OPTICAL OUTPUT POWER OF A LASER DIODE WITH AN ASSOCIATED PHOTODIODE AND PARTICLE SENSOR DEVICE

This application claims priority to German Application No. DE 10 2018 212 687.9, filed on Jul. 30, 2018. The entire contents of the above-mentioned German patent application is incorporated herein by reference as part of the disclosure of this U.S. application.

FIELD OF THE INVENTION

The present invention relates to a method and to an apparatus for monitoring the optical output power of a laser diode having an associated photodiode, and to a particle sensor apparatus.

Although applicable to any apparatuses for monitoring the optical output power of a laser diode having an associated photodiode, the present invention and the underlying problems will be described in view of optical particle sensor apparatuses.

BACKGROUND

DE 10 2015 207 289 A1 discloses an optical particle sensor apparatus having a VCSEL laser diode with integrated photodiode. A VCSEL laser diode (VCSEL=vertical-cavity surface-emitting laser) is a light-emitting diode in which the light is emitted perpendicularly to the plane of the semiconductor chip. Using the self-mixing-interference technique, the known optical particle sensor apparatus makes it possible to obtain information relating to a presence of particles and the velocity thereof.

The optical particle sensor apparatus should be operated with a defined optical output power that should not only be as great as possible for a high level of measurement sensitivity of the sensor, but must also be limited for reasons of eye safety.

However, during the operation of the laser diode, the optical output power changes in dependence on the instantaneous temperature of the laser diode at the time point of the operation and on the aging condition of the laser diode in accordance with the life span degradation.

For example, adjustment or control of the set operating current of the laser diode during operation is thus necessary. In principle, this could be accomplished by way of a direct measurement of the optical output power, but in numerous miniaturized applications, in particular the aforementioned optical particle sensor apparatus, this is not possible.

Consequently, it would be desirable to find a solution that makes monitoring of the optical output power of a laser diode indirectly possible in order to thereby permit for example adjustment or feedback control of the laser diode current during operation.

SUMMARY OF THE DISCLOSURE

The present invention provides an apparatus and a method for monitoring the optical output power $P_{ist}$ of a laser diode having an associated photodiode and a particle sensor apparatus The idea on which the present invention is based is that monitoring or feedback-controlling the optical output power is effected during the operation of the laser diode and is based on current measurements and/or voltage measurements at the laser diode and at the photodiode.

Advantageously, aging, production fluctuations, and temperature dependence of the laser diode and the associated photodiode can in this way be taken into account by way of corresponding electrical measurements at the laser diode and at the photodiode, without making a direct optical measurement necessary.

According to a preferred embodiment, the laser diode having the associated photodiode is a laser diode having an integrated photodiode, in particular a VCSEL having an integrated photodiode. Such an arrangement is particularly compact.

According to a further preferred embodiment, a respective instantaneous photodiode characteristic is determined using measurements of the photodiode current IPD in dependence on the laser diode current ILD, the instantaneous threshold current Ith of the laser diode is determined from the respective instantaneous photodiode characteristic, the slope PDSlope of the instantaneous photodiode characteristic is determined for a laser diode current range within which the laser diode lies during laser operation, and the laser diode voltage ULD for at least one specified laser diode current ILDV is captured. This has the advantage that the instantaneous laser diode characteristic is obtainable by simple current measurements and voltage measurements.

According to a further preferred embodiment, the instantaneous threshold current Ith is ascertained by capturing first photodiode current values IPD1, IPD2 for at least two laser diode current values ILD1, ILD2 at which the laser diode is not yet in laser operation, by capturing second photodiode current values IPD3, IPD4 for at least two laser diode current values ILD3, ILD4 at which the laser diode is in laser operation, by in each case linearly extrapolating the first photodiode current values IPD1, IPD2 and the second photodiode current values IPD3, IPD4, and by determining the intersection of the two resulting straight lines g and h as the instantaneous threshold current Ith.

In accordance with a further preferred embodiment, the respective instantaneous optical output power P of the at least one laser diode is estimated as $P_{ist}$=(ILD−Ith)*LDSlope, wherein LDSlope represents the slope of the laser diode characteristic ULDK and a previously determined relationship fkt between the slope LDSlope of the instantaneous laser diode characteristic ULDK, the instantaneous laser diode current ILD, the instantaneous laser diode voltage ULD at the specified laser diode current ILDV and the slope PDSlope of the instantaneous photodiode characteristic is used as the basis for the estimation of the instantaneous output power $P_{ist}$, specifically LDSlope=fkt (ILD, ULD (ILDV), PDSlope). This relationship can be represented empirically or by way of a corresponding model.

According to a further preferred embodiment, the optical output power P of the at least one laser diode is feedback-controlled by way of comparing the estimated instantaneous optical output power $P_{ist}$ to a desired value for the optical output power $P_{soll}$, and the instantaneously applied laser diode current ILD is feedback-controlled such that a deviation of the instantaneously estimated optical output power $P_{ist}$ from the desired value of the optical output power $P_{soll}$ is as low as possible. In this way, the optical output power can be kept continuously constant.

According to a further preferred embodiment, the optical output power P of the at least one laser diode is feedback-controlled by virtue of ascertaining the laser diode current $ILD_{set}$ that is to be set in each case instantaneously to attain a predetermined optical desired output power $P_{soll}$ of the laser diode as $$ILD_{set}=ILDT+a1*Ith+a2*IthT+b1*ULD(ILDV)+b2*ULDT+c1*PDSlope+c2*PDSlopeT+d$$

where

ILDT is the laser diode current value at which the laser diode has generated the predetermined optical desired output power $P_{soll}$ at a defined time point $t_0$ at a defined temperature T, Ith is the instantaneous threshold current Ith of the laser diode determined during operation, IthT is the threshold current Ith of the laser diode determined at the time point $t_0$ at the defined temperature T, ULD(ILDV) is the laser diode voltage ULD measured during operation for a specified laser diode current ILDV, ULDT is the laser diode voltage measured at the time point $t_0$ at the defined temperature T for the specified laser diode current ILDV, PDSlope is the instantaneous slope, determined during operation, of the photodiode characteristic in the laser diode current range within which the laser diode lies during laser operation, PDSlopeT is the slope of the photodiode characteristic, determined at the time point $t_0$ at the defined temperature T, in the laser diode current range within which the laser diode lies during laser operation, a1, a2, b1, b2, c1, c2, d represent coefficients that have been ascertained empirically or using a model for a plurality of laser diodes of the same design.

In this way, a high feedback-control accuracy can be attained.

According to a further preferred embodiment, the optical output power P of the at least one laser diode is feedback-controlled by virtue of ascertaining the laser diode current $ILD_{set}$ that is to be set in each case instantaneously to attain a predetermined optical desired output power $P_{soll}$ of the laser diode as $$ILD_{set}=ILDT+a*(Ith-IthT)+b*(ULD(ILDV)-ULDT)+c*(PDSlope-PDSlopeT)+d$$

where

ILDT is the laser diode current value at which the laser diode has generated the predetermined optical desired output power $P_{soll}$ at a defined time point $t_0$ at a defined temperature T, Ith is the instantaneous threshold current Ith of the laser diode determined during operation, IthT is the threshold current Ith of the laser diode determined at the time point $t_0$ at the defined temperature T, ULD(ILDV) is the laser diode voltage ULD measured during operation for a specified laser diode current ILDV, ULDT is the laser diode voltage measured at the time point $t_0$ at the defined temperature T for the specified laser diode current ILDV, PDSlope is the instantaneous slope, determined during operation, of the photodiode characteristic in the laser diode current range within which the laser diode lies during laser operation, PDSlopeT is the slope of the photodiode characteristic, determined at the time point $t_0$ at the defined temperature T, in the laser diode current range within which the laser diode lies during laser operation, a, b, c, d represent coefficients that have been ascertained empirically for a plurality of laser diodes of the same design.

This method avoids the parasitic influence of offset errors during capturing of currents and voltages at the laser diode and at the photodiode and consequently reduces the accuracy requirements concerning measurement technology.

According to a further preferred embodiment, the laser diode current $ILD_{set}$ to be set is determined and set continuously, in predetermined time intervals, or in an event-initiated fashion during operation to obtain the predetermined optical desired output power $P_{soll}$ of the laser diode. This ensures permanent stability of the optical output power.

According to a further preferred embodiment, the monitoring device is configured such that it estimates an instantaneous optical output power $P_{ist}$ of the at least one laser diode, and has a switch-off apparatus that is set up to automatically switch off the laser diode when the instantaneous optical output power P of the laser diode exceeds a first specified limit value and/or falls below a second specified limit value. This increases operational safety.

According to a further preferred embodiment, the monitoring device is configured such that it estimates the instantaneous optical output power $P_{ist}$ of the at least one laser diode, and has a comparison device that is set up to compare the instantaneously estimated optical output power $P_{ist}$ to a specified desired output power $P_{soll}$ of the laser diode, and has a feedback control device that is set up to feedback-control the laser diode current ILD such that a difference $P_{ist}-P_{soll}$ is as low as possible. In this way, simple feedback control of the optical output power can be attained.

According to a further preferred embodiment, the monitoring device is set up to ascertain a laser diode current $I\_LD_{set}$ that is to be set and to control the current source for setting and applying the ascertained laser diode current $I\_LD_{set}$ that is to be set to the laser diode. In this way, the current source can be used both for monitoring and for normal operation of the laser diode.

According to a further preferred embodiment, the monitoring device in the particle sensor apparatus is set up to estimate the instantaneous optical output power $P_{ist}$ of the at least one laser diode, wherein the measurement signal evaluation device is configured such that the estimated instantaneous optical output power $P_{ist}$ is taken into account in the evaluation of the measurement signals. This increases the measurement accuracy of the particle sensor apparatus.

According to a further preferred embodiment, a feedback control device for the optical output power P of the at least one laser diode is provided in the particle sensor apparatus, with which the optical output power P is selectively settable such that particles of different particle size are selectively detectable and accordingly different particle distributions are measurable, in particular PM1, PM2.5 and PM10. This increases the flexibility of the particle sensor apparatus.

BRIEF DESCRIPTION OF THE DRAWINGS

In the figures.

Identical or functionally identical elements are denoted in the figures with the same reference signs.

DETAILED DESCRIPTION

Figure 1A:
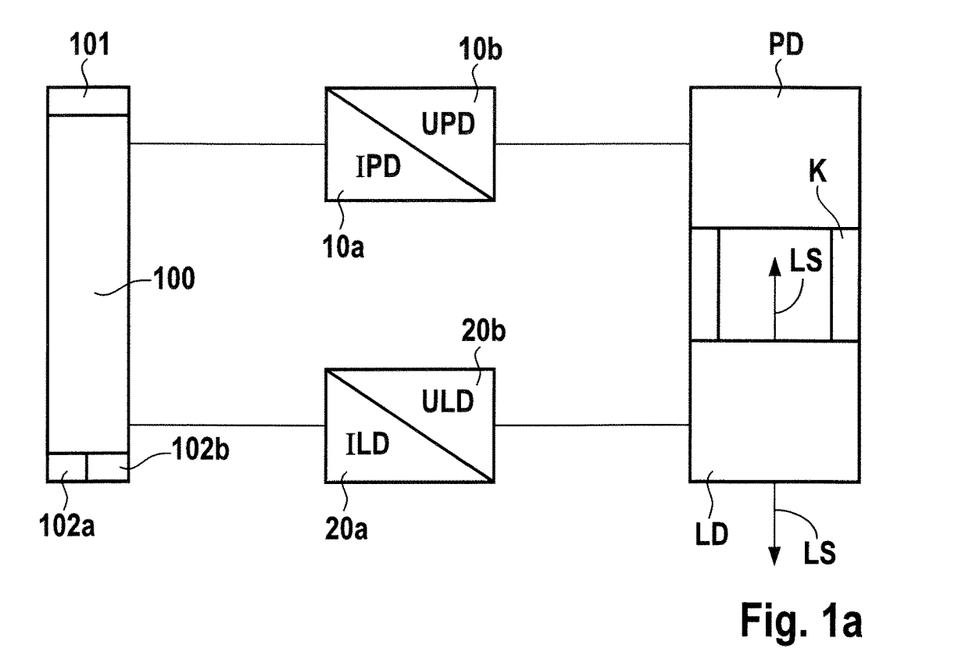
FIG. 1a) shows a block diagram for explaining a method and an apparatus for monitoring the optical output power of a laser diode having an associated photodiode according to a first embodiment of the present invention.

FIG. 1a) shows a block diagram for explaining a method and an apparatus for monitoring the optical output power of a laser diode having an associated photodiode according to a first embodiment of the present invention.

The apparatus comprises a laser diode LD and a photodiode PD that is associated with the laser diode LD such that the photodiode PD is operable together with the laser diode LD. The photodiode PD is arranged such that it can detect the light LS of the laser diode LD and convert it into an electrical current IPD at constant applied operating voltage UPD at the photodiode PD. When used in an optical particle sensor apparatus, the light LS of the laser diode LD at the same time functions as the measurement beam.

The photodiode PD is thermally coupled to the laser diode LD via a coupling device K such that the photodiode PD and the laser diode LD are substantially at the same temperature during operation.

In one variant, the laser diode LD has an integrated photodiode PD, and is in particular a VCSEL (vertical-cavity surface-emitting laser) with an integrated photodiode, but the embodiment is in general not limited thereto, but rather applicable to any desired functionally and thermally coupled arrangements of at least one laser diode having at least one associated photodiode.

A voltage source 10b serves for applying the constant operating voltage UPD to the photodiode PD. This constant operating voltage UPD can optionally be freely selectable. A current measurement device 10a serves for capturing the photodiode current IPD. A current source 20a serves for applying a feedback-controllable current ILD to the laser diode LD, and a voltage measurement device 20b serves for capturing the output voltage ULD of the laser diode LD.

A monitoring device 100, which is connected to the current measurement device 10a, the voltage source 10b, the current source 20a, and the voltage measurement device 20b and can control said components during operation, serves for monitoring the optical output power P during operation of the laser diode LD based on current measurements and/or voltage measurements at the laser diode LD and at the photodiode PD. In the example described, these are current measurements at the photodiode PD in the case of specifiable currents of the laser diode and voltage measurements at the laser diode LD in the case of specifiable currents of the laser diode. Alternatively, however, different current and voltage measurements are possible.

The monitoring device 100 is configured such that it estimates an instantaneous optical output power $P_{ist}$ of the laser diode LD in intervals during operation.

The monitoring device 100 has, as an optional security feature, a switch-off apparatus 101 that is set up to automatically switch off the laser diode LD when the instantaneous optical output power P of the laser diode exceeds a first specified limit value and/or falls below a second specified limit value.

In addition, the monitoring device 100 has a comparison device 102a that is set up to compare the instantaneously estimated optical output power $P_{ist}$ to a specified desired output power $P_{soll}$ of the laser diode LD. The output signal of the comparison device 102a is supplied to a feedback control device 102b, which is likewise a constituent part of the monitoring device 100. The feedback control device 102b is set up to feedback-control the laser diode current ILD using the current source 20a such that a difference $P_{ist}-P_{soll}$ is as low as possible, or is zero.

Figure 1B:
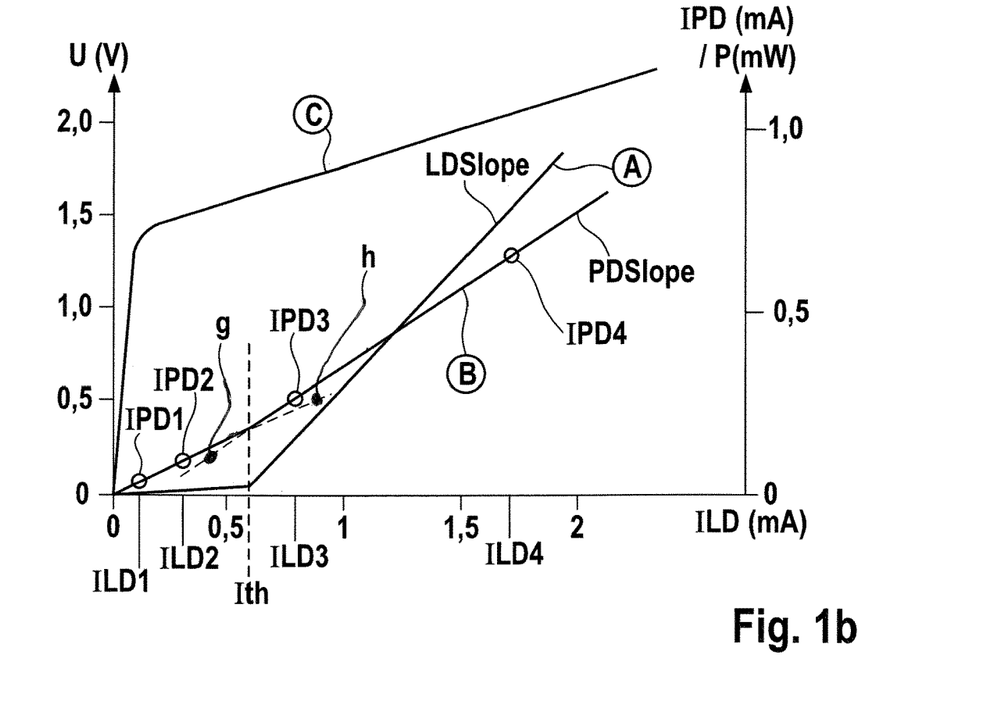
FIG. 1b) shows an illustration of the current-output power characteristic (curve A) of the laser diode and the laser current-photodiode current characteristic (curve B) of the photodiode and the current-voltage characteristic of the laser diode (curve C) for explaining the method and the apparatus for estimating a condition parameter of the laser diode having the associated photodiode according to the first embodiment of the present invention.

FIG. 1b) shows an illustration of the current-output power characteristic (curve A) of the laser diode and the laser current-photodiode current characteristic (curve B) of the photodiode and the current-voltage characteristic of the laser diode (curve C) for explaining the method and the apparatus for estimating a condition parameter of the laser diode having the associated photodiode according to the first embodiment of the present invention.

ULD here denotes the laser diode voltage in volt (V), ILD denotes the laser diode current in milliampere (mA), P denotes the output power of the laser diode in milliwatts (mW), and IPD denotes the photodiode current in milliampere (mA).

The current-output power characteristic of the laser diode LD as per curve A in FIG. 1b has, in the lower current region, only a very low slope up to a threshold current Ith, which is approximately 0.6 mA in the present example. When the threshold current Ith of the laser diode LD is exceeded, laser operation begins, and the slope of the current-output power characteristic abruptly increases significantly. The slope of the current-output power characteristic of the laser diode LD is denoted with LDSlope in FIG. 1b.

The corresponding laser current-photodiode current characteristic of the photodiode PD with constant voltage at the photodiode PD is illustrated by curve B.

The corresponding laser current-photodiode current characteristic of the photodiode PD has the depicted profile. A bend that occurs in the laser current-photodiode current characteristic of the photodiode PD at the threshold current Ith of the laser diode LD when laser operation begins is less pronounced than the bend in the current-output power characteristic of the laser diode LD, and the slope in the lower current region is greater than that of the laser diode LD. The slope of the laser current-photodiode current characteristic of the photodiode PD above the threshold current Ith of the laser diode LD is designated PDSlope in FIG. 1 and is lower than the corresponding slope LDSlope of the current-output power characteristic of the laser diode LD.

It has been found that not only is there a correlation between the bend in the laser current-photodiode current characteristic of the photodiode PD and the threshold current Ith of the laser diode LD, but there is also a strong correlation between the slopes LDSlope and PDSlope.

Consequently, electrical measurements of the laser current-photodiode current characteristic of the photodiode PD can provide information relating to the profile of the current-output power characteristic of the laser diode LD. However, to obtain more detailed information relating to the temperature dependence and the aging condition, production fluctuations of the product series must also be taken into consideration, as will be explained further below.

As is indicated in FIG. 1b), the photodiode current IPD1, IPD2, IPD3, IPD4 is determined at different predetermined currents ILD1, ILD2, ILD3, ILD4 of the laser diode LD during operation of the laser diode LD, wherein the voltage UPD at the photodiode PD is kept constant.

The current values ILD1, ILD2 in this case lie in the lower region of the current-output power characteristic of the laser diode LD, that is to say below the threshold current Ith of the laser diode LD, and the current values ILD3, ILD4 lie in the upper region of the current-output power characteristic of the laser diode LD, that is to say above the threshold current Ith of the laser diode LD.

On account of a linear extrapolation (indicated in dashes) of two straight lines g and h, extending through the measured photodiode current values IPD1, IPD2 and IPD3, IPD4, it is possible to determine with every measurement the threshold current Ith of the laser diode LD and the slope PDSlope of the laser current photodiode current characteristic of the photodiode PD above the threshold current Ith of the laser diode LD.

The first embodiment of the method according to the invention for monitoring the optical output power P of the laser diode LD uses the values of Ith and PDSlope, determined on the basis of the photodiode PD at predetermined time intervals or in an event-initiated fashion, and additionally a measured value of a voltage drop ULD at the laser diode LD at a predetermined laser diode current ILDV, for example 10 microampere, and further previously determined parameters that take into account the temperature dependence, the aging condition, and the production fluctuations of the product series, as will be explained in more detail below.

The respective instantaneous optical output power $P_{ist}$ of the laser diode LD is estimated during operation as $$P_{ist} = (ILD - Ith) * LDSlope$$

wherein LDSlope represents the not directly ascertainable slope of the current-output power characteristic of the laser diode LD.

The estimation of the instantaneous output power $P_{ist}$ is based on a previously determined functional relationship fkt between the slope LDSlope of the instantaneous current-output power characteristic of the laser diode LD, the instantaneous laser diode current ILD, the instantaneous laser diode voltage ULD at a specified laser diode current ILDV, and the ascertained slope PDSlope of the instantaneous photodiode characteristic, specifically $$LDSlope = fkt(ILD, ULD(ILDV), PDSlope).$$

The feedback control device 102 feedback-controls the optical output power P of the laser diode LD by virtue of ascertaining the laser diode current $ILD_{set}$ that is to be set in each case instantaneously to attain a predetermined optical desired output power $P_{soll}$ of the laser diode LD as $$ILD_{set} = ILDT + a1*Ith + a2*IthT + b1*ULD(ILDV) + b2*ULDT + c1*PDSlope + c2*PDSlopeT + d$$

wherein the following coefficients and measurement values are used:

ILDT is the laser diode current value at which the laser diode LD has generated the predetermined optical desired output power $P_{soll}$ at a defined time point $t_0$ at a defined temperature T, Ith is the instantaneous threshold current Ith of the laser diode LD determined during operation, IthT is the threshold current Ith of the laser diode LD determined at the time point $t_0$ at the defined temperature T, ULD(ILDV) is the laser diode voltage ULD measured during operation for a specified laser diode current ILDV, ULDT is the laser diode voltage measured at the time point $t_0$ at the defined temperature T for the specified laser diode current ILDV, PDSlope is the instantaneous slope, determined during operation, of the photodiode characteristic in the laser diode current range within which the laser diode LD lies during laser operation, PDSlopeT is the slope of the photodiode characteristic, determined at the time point $t_0$ at the defined temperature T, in the laser diode current range within which the laser diode LD lies during laser operation, a1, a2, b1, b2, c1, c2, d represent coefficients that have been ascertained empirically for a plurality of laser diodes of the same design.

Said empirical ascertainment is effected in what is known as a trimming procedure, wherein the parameters a1, a2, b1, b2, c1, c2 and d are determined by way of a regression fit of a series of measurement values of samples at defined conditions or are ascertained on the basis of a model.

In the above-described method, each term can be provided with an individual coefficient, which increases the accuracy of the adjustment.

In an alternative method, the feedback control device 102 feedback-controls the optical output power P of the laser diode LD by virtue of ascertaining the laser diode current $ILD_{set}$ that is to be set in each case instantaneously to attain a predetermined optical desired output power $P_{soll}$ of the laser diode LD as $$ILD_{set} = ILDT + a*(Ith - IthT) + b*(ULD(ILDV) - ULDT) + c*(PDSlope - PDSlopeT) + d$$

wherein the following coefficients and measurement values are used:

ILDT is the laser diode current value at which the laser diode LD has generated the predetermined optical desired output power $P_{soll}$ at a defined time point $t_0$ at a defined temperature T, Ith is the instantaneous threshold current Ith of the laser diode LD determined during operation, IthT is the threshold current Ith of the laser diode determined at the time point $t_0$ at the defined temperature T, ULD(ILDV) is the laser diode voltage ULD measured during operation for a specified laser diode current ILDV, ULDT is the laser diode voltage measured at the time point $t_0$ at the defined temperature T for the specified laser diode current ILDV, PDSlope is the instantaneous slope, determined during operation, of the photodiode characteristic in the laser diode current range within which the laser diode LD lies during laser operation, PDSlopeT is the slope of the photodiode characteristic, determined at the time point $t_0$ at the defined temperature T, in the laser diode current range within which the laser diode LD lies during laser operation, a, b, c, d represent coefficients that have been ascertained empirically for a plurality of laser diodes of the same design.

In this variant of the method, three difference terms are used to counteract offset errors.

The first difference term (Ith−IthT) takes into account the aging and the production fluctuations during production. The second difference term (ULD−ULDT) takes into account the temperature influence on the laser diode LD. The third difference term (PDSlope−PDSlopeT) takes into account the temperature influence on the spectral sensitivity of the laser diode.

As before, the parameters a, b, c, and d are determined in the trimming procedure by way of a regression fit of a series of measurement values of samples at defined conditions.

Figure 2:
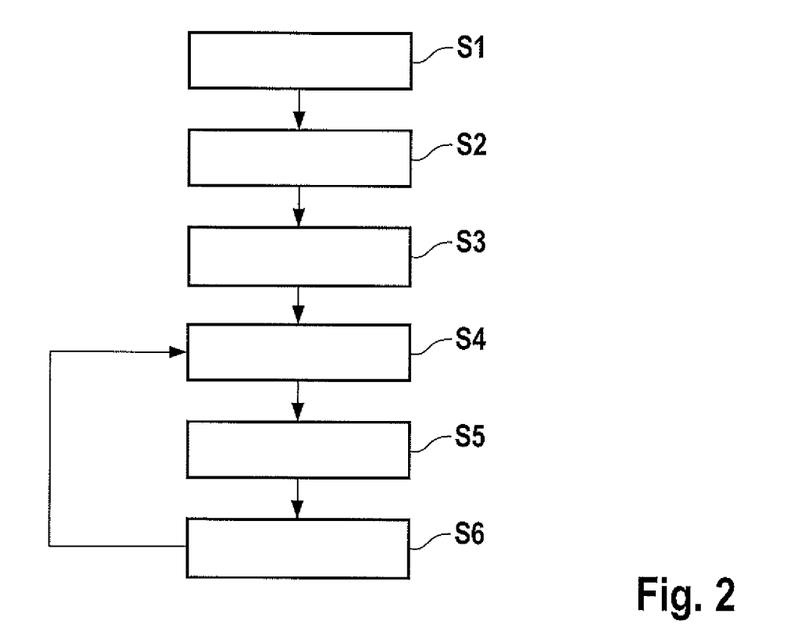
FIG. 2 shows a flowchart for explaining the method and the apparatus for monitoring the optical output power of a laser diode having an associated photodiode according to the first embodiment of the present invention.

FIG. 2 is a flowchart for explaining the method for monitoring the optical output power of a laser diode in an arrangement with at least one laser diode and at least one photodiode according to the first embodiment of the present invention.

According to FIG. 2, in step S1, the measurement variables ILDT, IthT, ULDT, PDSlopeT are defined, as explained above.

In step S2, the parameters a1, a2, b1, b2, c1, c2, d and a, b, c, d are provided.

In step S3, operation of the laser diode LD begins with an initial laser diode current, for example ILDT.

Next, feedback control of the laser diode current ILD is effected during operation at intervals by repeated performance of the subsequent steps S4 to S6.

In step S4, an instantaneous voltage drop ULD across the laser diode LD at the specified current ILDV of the laser diode LD is captured.

In step S4, capturing of an instantaneous threshold current Ith of the laser diode LD on the basis of the photodiode current measurements and capturing of an instantaneous slope PDSlope of the photodiode characteristic above the instantaneous threshold current Ith is likewise performed, as explained with reference to FIG. 1b).

In step S5, the instantaneous laser diode current $ILD_{set}$ that is to be set is ascertained in accordance with the above-stated relationship.

If the ascertained instantaneous difference $ILD-ILD_{set}$ does not equal zero, the laser diode current ILD is adjusted in step S6 based on the ascertained instantaneous difference. Otherwise, the laser diode current ILD is left unchanged.

After step S6, the method jumps back to step S4. The feedback control loop of steps S4 to S6 can be performed for example cyclically once per second.

Figure 3:
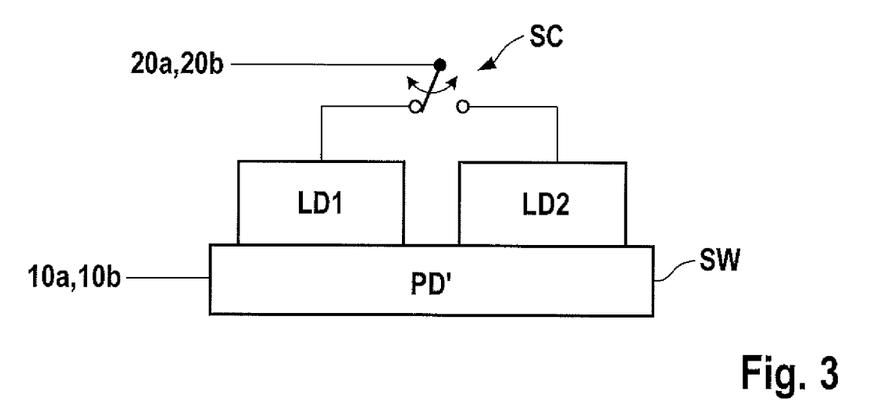
FIG. 3 shows an integrated arrangement having two laser diodes and an associated photodiode for use in a second embodiment of the present invention.

FIG. 3 shows an integrated arrangement having two laser diodes and a photodiode for use in a second embodiment of the present invention.

In the second embodiment, a first laser diode LD1 and a second laser diode LD2 and also a photodiode Pa are integrated in a common substrate SU, in particular in the form of a VCSEL laser diode with integrated photodiode, wherein light is emitted perpendicularly to the plane of the substrate SU.

Feedback-controlling the optical output power of the laser diodes LD1, LD2 is effected for example as described in the first embodiment.

For the alternating monitoring of the optical output power P of the first laser diode LD1 and the second laser diode LD2, a switching device SC is provided for connecting to the current measurement device 10a and the voltage source 10b.

Although the present invention has been described completely above on the basis of preferred exemplary embodiments, it is not restricted thereto, but rather can be modified in diverse ways.

Although the functional dependence in the case of the above embodiments is empirically ascertained in a trimming procedure, this could also be accomplished by way of a theoretical model.

The result of the monitoring of the optical output power also does not necessarily have to be used for feedback control, but can be used as desired for internal and/or external technical measures in the system.

Monitoring can be effected with any desired number of laser diodes and any desired number of associated photodiodes.

The invention claimed is:

1. A method for monitoring the optical output power $P_{ist}$ of at least one laser diode, wherein at least one photodiode is associated with the laser diode,
   which is operable together with the laser diode,
   which detects the light of the laser diode and converts it into an electrical current IPD, and
   which is thermally coupled to the laser diode,
   wherein the optical output power $P_{ist}$ is monitored during the operation of the laser diode and the monitoring is based on:
   measurements of the photodiode current IPD of the at least one photodiode in dependence on the laser diode current ILD of the laser diode;
   determining a respective instantaneous laser current-photodiode current-curve by way of the measurements of the photodiode current IPD;
   determining the instantaneous threshold current Ith of the laser diode from the respective instantaneous laser current-photodiode current-curve;
   determining the slope PDSlope of the instantaneous laser current-photodiode current-curve for a laser diode current region within which the at least one laser diode is in laser operation, and capturing the laser diode voltage ULD(ILDV) for one specified laser diode current ILDV of the laser diode, and
   wherein the optical output power $P_{ist}$ of the at least one laser diode is estimated as $P_{ist}=(ILD-Ith)*LDSlope$, where LDSlope represents the slope of the current-output power curve of the laser diode, and
   wherein the estimation of the optical output power $P_{ist}$ is based on a previously determined relationship fkt between the slope LDSlope of the current-output power curve of the laser diode, the laser diode current ILD of the laser diode, the laser diode voltage ULD(ILDV) at the specified laser diode current ILDV, and the slope PDSlope of the instantaneous laser current-photodiode current-curve, in which the relationship is LDSlope=fkt (ILD, ULD(ILDV), PDSlope).

2. The method as claimed in claim 1, wherein the laser diode having the associated photodiode is a laser diode having an integrated photodiode.

3. The method as claimed in claim 2, wherein the laser diode having an integrated photodiode is a VCSEL (vertical-cavity surface-emitting laser) having an integrated photodiode.

4. The method as claimed in claim 1, wherein the instantaneous threshold current Ith is ascertained
   by capturing first photodiode current values IPD1, IPD2 for at least two laser diode current values ILD1, ILD2 at which the laser diode is not yet in laser operation,
   by capturing second photodiode current values IPD3, IPD4 for at least two laser diode current values ILD3, ILD4 at which the laser diode is in laser operation,
   by linearly extrapolating the first photodiode current values IPD1, IPD2 to determine a first straight line h and the extrapolating the second photodiode current values IPD3, IPD4 to determine a second straight line g, and
   by determining the intersection of the first resulting straight line h and the second resulting straight line g as the instantaneous threshold current Ith.

5. The method as claimed in claim 1, wherein the optical output power $P_{ist}$ of the at least one laser diode is feedback-controlled by virtue of
comparing the estimated optical output power $P_{ist}$ to a desired value for the optical output power $P_{soll}$, and feedback-controlling the applied laser diode current ILD in a manner such that a deviation of the estimated optical output power $P_{ist}$ from the desired value of the optical output power $P_{soll}$ is as low as possible.

6. The method as claimed in claim 1, wherein the optical output power $P_{ist}$ of the at least one laser diode is feedback-controlled by virtue of ascertaining a laser diode current $ILD_{set}$ that is to be set in each case instantaneously to attain a predetermined optical desired output power $P_{soll}$ of the laser diode as $$ILD_{set}=ILDT+a1*Ith+a2*IthT+b1*ULD(ILDV)+b2*ULDT+c1*PDSlope+c2*PDSlopeT+d$$

where
ILDT is the laser diode current value at which the laser diode has generated the predetermined optical desired output power $P_{soll}$ at a defined time point $t_0$ at a defined temperature T,
Ith is the instantaneous threshold current Ith of the laser diode determined during operation,
IthT is the threshold current Ith of the laser diode determined at the time point $t_0$ at the defined temperature T,
ULD(ILDV) is the laser diode voltage ULD measured during operation for a specified laser diode current ILDV,
ULDT is the laser diode voltage measured at the time point $t_0$ at the defined temperature T for the specified laser diode current ILDV,
PDSlope is the instantaneous slope, determined during operation, of the photodiode characteristic in the laser diode current range within which the laser diode lies during laser operation,
PDSlopeT is the slope of the photodiode characteristic, determined at the time point $t_0$ at the defined temperature T, in the laser diode current range within which the laser diode lies during laser operation,
a1, a2, b1, b2, c1, c2, d represent coefficients that have been ascertained empirically for a plurality of laser diodes of the same design.

7. The method as claimed in claim 6, wherein the laser diode current $ILD_{set}$ to be set is determined and set continuously, in predetermined time intervals or in an event-initiated fashion, during operation to obtain the predetermined optical desired output power $P_{soll}$ of the laser diode.

8. The method as claimed in claim 1, wherein the optical output power $P_{ist}$ of the at least one laser diode is feedback-controlled by virtue of ascertaining a laser diode current $ILD_{set}$ that is to be set in each case instantaneously to attain a predetermined optical desired output power $P_{soll}$ of the laser diode as $$ILD_{set}=ILDT+a*(Ith-IthT)+b*(ULD(ILDV)-ULDT)+c*(PDSlope-PDSlopeT)+d$$

where
ILDT is the laser diode current value at which the laser diode has generated the predetermined optical desired output power $P_{soll}$ at a defined time point $t_0$ at a defined temperature T,
Ith is the instantaneous threshold current Ith of the laser diode determined during operation,
IthT is the threshold current Ith of the laser diode determined at the time point $t_0$ at the defined temperature T,
ULD(ILDV) is the laser diode voltage ULD measured during operation for a specified laser diode current ILDV,
ULDT is the laser diode voltage measured at the time point $t_0$ at the defined temperature T for the specified laser diode current ILDV,
PDSlope is the instantaneous slope, determined during operation, of the photodiode characteristic in the laser diode current range within which the laser diode lies during laser operation,
PDSlopeT is the slope of the photodiode characteristic, determined at the time point $t_0$ at the defined temperature T, in the laser diode current range within which the laser diode lies during laser operation,
a, b, c, d represent coefficients that have been ascertained empirically for a plurality of laser diodes of the same design.

9. An apparatus for monitoring the optical output power $P_{ist}$ of at least one laser diode, wherein at least one photodiode is associated with the laser diode,
which is operable together with the laser diode,
with which the light of the laser diode is detectable and convertible into an electrical current IPD, and
which is thermally coupled to the laser diode,
comprising at least;
a current source for applying a laser diode current ILD to the at least one laser diode,
a voltage measuring device for capturing the laser diode voltage ULD of the laser diode,
a voltage source for the at least one photodiode for applying an operating voltage for the photodiode,
a current measurement device for capturing the photodiode current IPD, and
a monitoring device for monitoring the optical output power $P_{ist}$ during the operation of the laser diode based on measurements of the photodiode current IPD of the at least one photodiode in dependence on the laser diode current ILD of the laser diode:
by determining a respective instantaneous laser current-photodiode current-curve by way of the measurements of the photodiode current IPD,
by determining the instantaneous threshold current Ith of the laser diode from the respective instantaneous laser current-photodiode current-curve,
by determining the slope PDSlope of the instantaneous laser current-photodiode current-curve for a laser diode current region within which the at least one laser diode is in laser operation, and by capturing the laser diode voltage ULD(ILDV) for one specified laser diode current ILDV of the laser diode,
wherein the optical output power $P_{ist}$ of the at least one laser diode is estimated as $P_{ist}=(ILD-Ith)*LDSlope$, and
wherein LDSlope represents the slope of the current-output power curve of the laser diode, and the estimation of the optical output power $P_{ist}$ is based on a previously determined relationship fkt between the slope LDSlope of the current-output power curve of the laser diode, the laser diode current ILD of the laser diode, the laser diode voltage ULD(ILDV) at the specified laser diode current ILDV, and the slope PDSlope of the instantaneous laser current-photodiode current-curve, in which the relationship is LDSlope=fkt (ILD, ULD(ILDV), PDSlope).

10. The apparatus as claimed in claim 9, wherein the monitoring device is configured such that it estimates an optical output power $P_{ist}$ of the at least one laser diode, and has a switch-off apparatus that is set up to automatically switch off the laser diode when the optical output power $P_{ist}$ of the laser diode exceeds a first specified limit value and/or falls below a second specified limit value.

11. The apparatus as claimed in claim 9, wherein the monitoring device is configured such that it estimates the optical output power $P_{ist}$ of the at least one laser diode, and has a comparison device that is set up to compare the estimated optical output power $P_{ist}$ to a specified desired output power $P_{soll}$ of the laser diode, and has a feedback control device that is set up to feedback-control the laser diode current ILD such that a difference $P_{ist}-P_{soll}$ is as low as possible.

12. The apparatus as claimed in claim 9, wherein the monitoring device is set up to ascertain a laser diode current $I\_LD_{set}$ that is to be set and to control the current source for setting and applying the laser diode current $I\_LD_{set}$ that is to be set to the laser diode.

13. An optical particle sensor apparatus having at least one laser diode for producing a measurement laser beam, having at least one photodiode that is associated with the laser diode and that is usable to detect the light of the measurement laser beam that is scattered at a particle to be detected as a measurement signal, and having a measurement signal evaluation device for determining a particle distribution, comprising an apparatus as claimed in claim 9.

14. The particle sensor apparatus as claimed in claim 13, wherein the at least one laser diode having the associated photodiode is a laser diode having an integrated photodiode.

15. The particle sensor apparatus as claimed in claim 13, wherein the monitoring device is set up to estimate an optical output power $P_{ist}$ of the at least one laser diode, wherein the measurement signal evaluation device is configured such that the estimated optical output power $P_{ist}$ is taken into account in the evaluation of the measurement signals.

16. The particle sensor apparatus as claimed in claim 13, wherein a feedback control device for the optical output power $P_{ist}$ of the at least one laser diode is provided, with which the optical output power $P_{ist}$ is selectively settable such that particles of different particle size are selectively detectable and accordingly different particle distributions are measurable.

17. The particle sensor apparatus as claimed in claim 13, wherein the at least one laser diode having the associated photodiode is a VCSEL (vertical-cavity surface-emitting laser) having an integrated photodiode.

* * * * *